United States Patent [19]

Fukuda et al.

[11] 4,156,820

[45] May 29, 1979

[54] MINIATURE CONTACTLESS SWITCHING UNIT

[75] Inventors: Hiroshi Fukuda, Urawa; Haruo Matsuzaka, Yokohama, both of Japan

[73] Assignee: Matsu Kyu Kabushiki Kaisha, Tokyo, Japan

[21] Appl. No.: 796,133

[22] Filed: May 12, 1977

[30] Foreign Application Priority Data

May 15, 1976 [JP] Japan .......................... 51/62510[U]

[51] Int. Cl.² ..................... H01L 43/06; H01H 36/00
[52] U.S. Cl. ................................. 307/309; 307/239; 338/32 H; 338/32 R; 200/84 C; 340/365 L
[58] Field of Search ................. 200/84 C; 338/32 R, 338/32 H; 340/365 R, 365 L; 178/17 C; 330/6; 307/239, 200, 309; 361/376

[56] References Cited

U.S. PATENT DOCUMENTS

| | | | |
|---|---|---|---|
| 3,652,878 | 3/1972 | Schmidt | 307/309 |
| 3,668,596 | 6/1972 | Hubrich | 338/32 R |
| 3,681,733 | 8/1972 | Masuda et al. | 338/32 R |
| 3,737,829 | 6/1973 | Schneider | 338/32 R |
| 3,848,216 | 11/1974 | Gamble | 340/365 L |
| 3,873,957 | 3/1975 | Wurscher et al. | 338/32 H |

*Primary Examiner*—John S. Heyman
*Attorney, Agent, or Firm*—J. Harold Nissen

[57] ABSTRACT

A miniature contactless switching unit is disclosed for use in various kinds of position sensors with a magneto-electro converter. The miniature contactless switching unit includes a molded block case in which a permanent magnet and the magneto-electro converter are oppositely disposed, and a screening member for screening magnetism, which operates in accordance with the movement of a moving member, whereby when the moving member is in a first position, the screening member is not disposed between the magnet and the magneto-electro converter to hold the output of the converter in a first switching state, while when the moving member is in a second position, the screening member is disposed between the magnet and the converter so as to prevent the magnetic flux from said magnet to the converter to hold the output of the converter in a second switching state.

8 Claims, 12 Drawing Figures

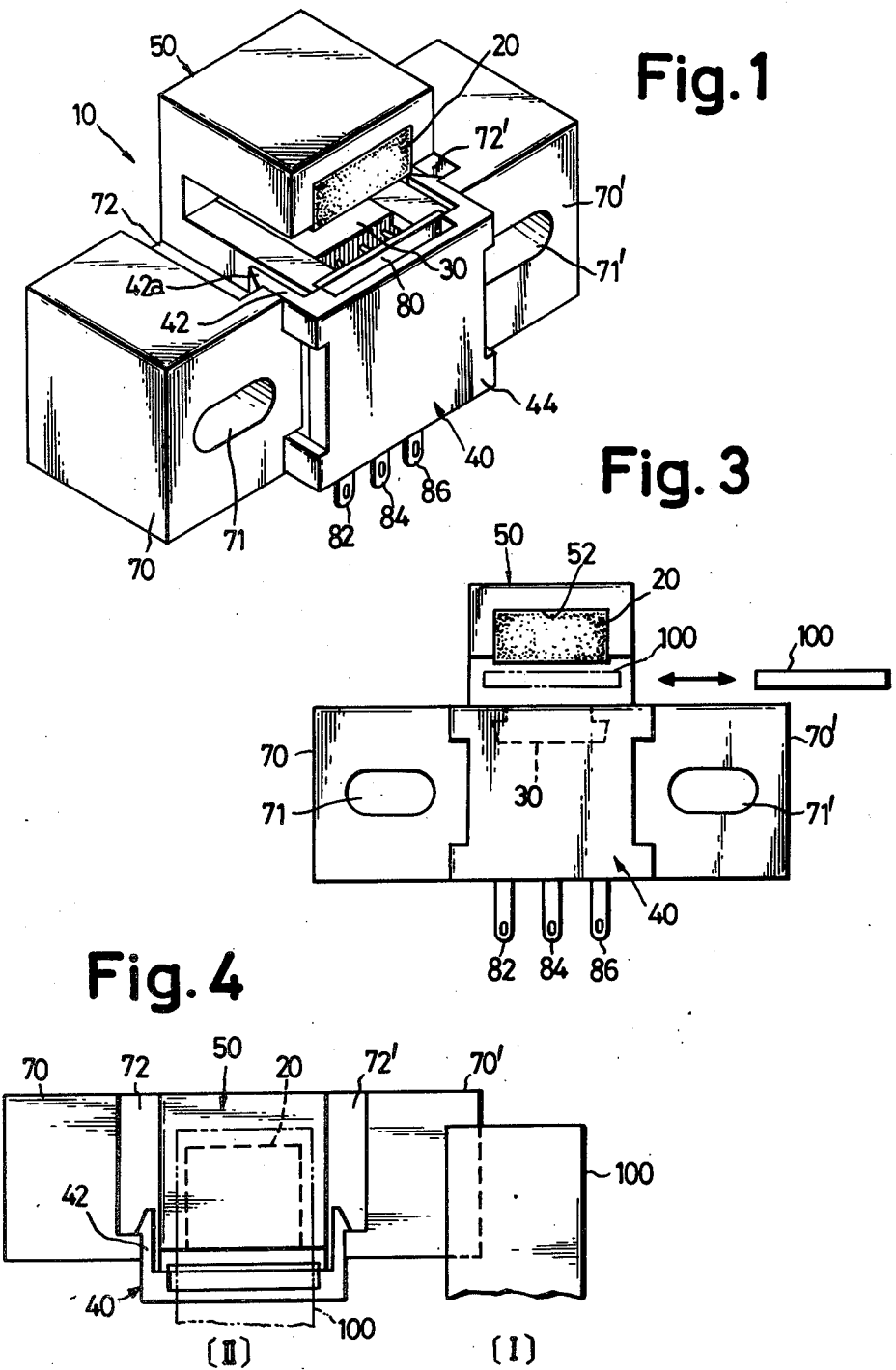

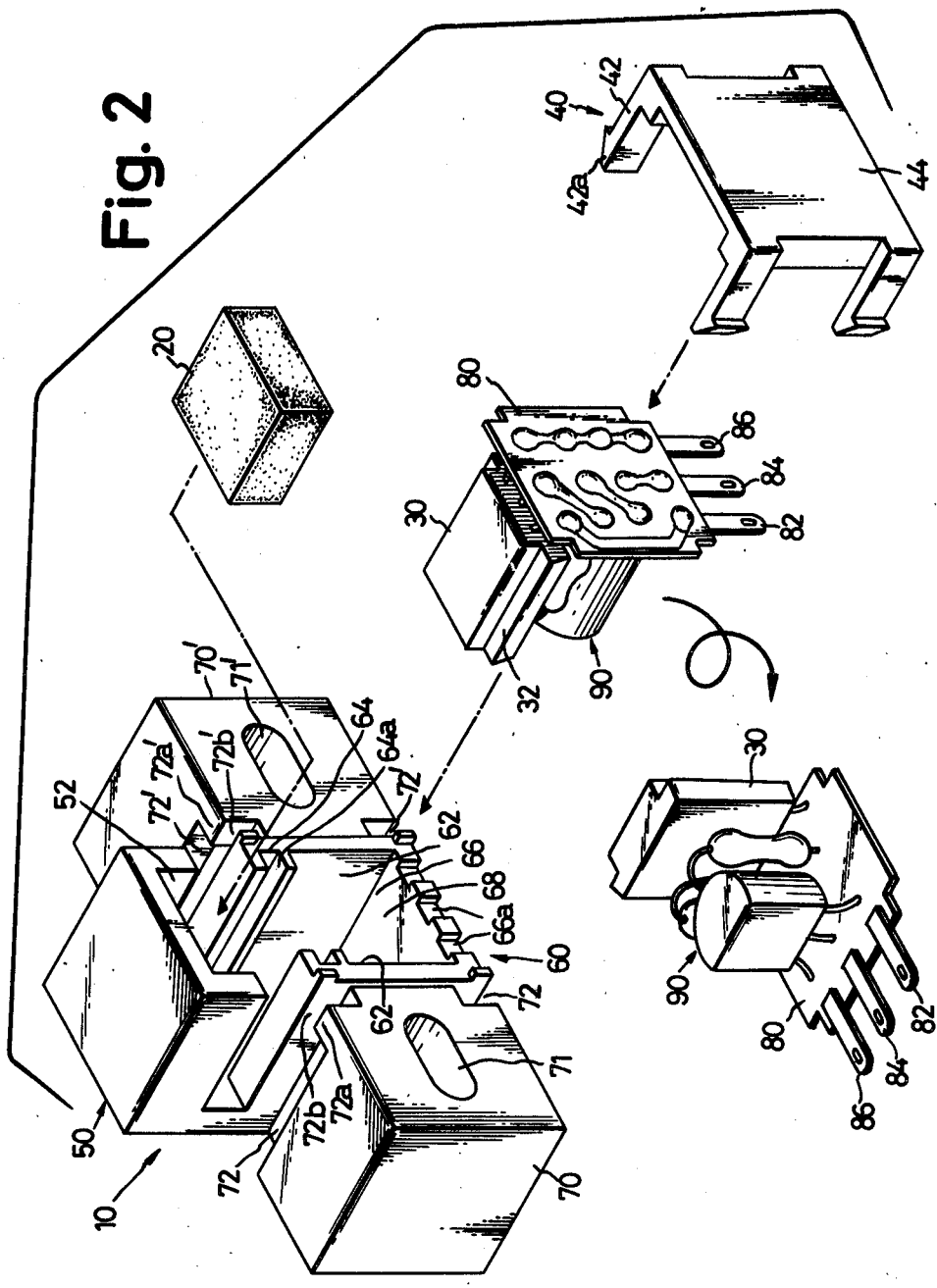

Fig. 5
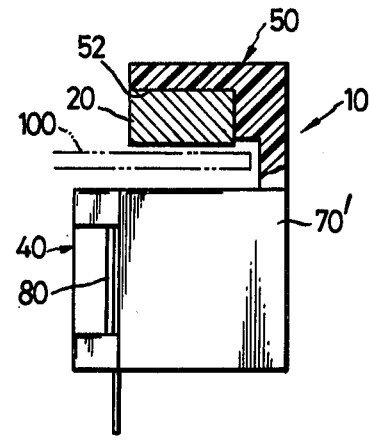
Fig. 6
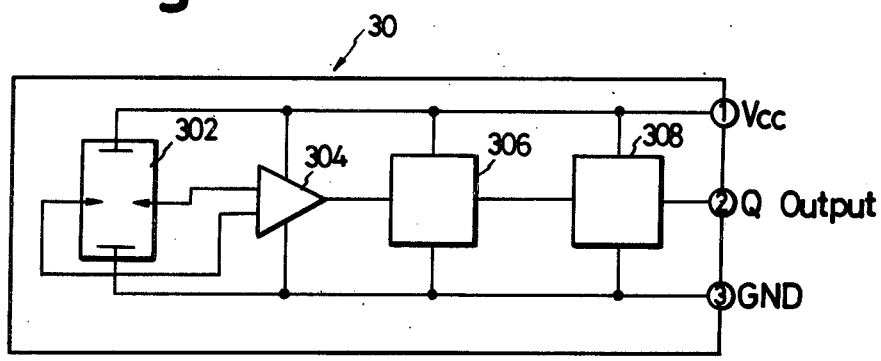
Fig. 7A   Fig. 7B   Fig. 7C
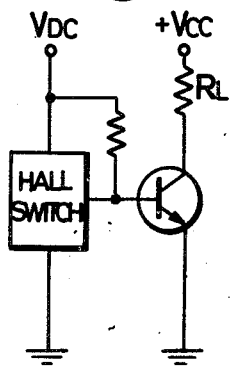 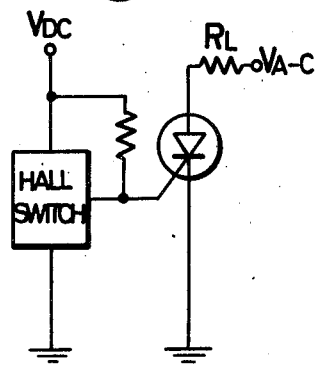 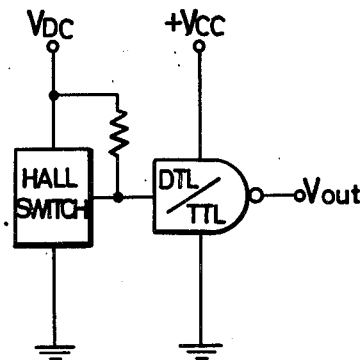

MINIATURE CONTACTLESS SWITCHING UNIT

BACKGROUND OF THE INVENTION

The present invention relates to a miniature contactless switching unit, and more particularly, to a switching unit in which a magneto-electro converter is assembled. For years, limit switches or reed switches have been employed in order to detect the position of moving members. However, some applications require performance beyond that obtainable with mechanical-to-electronic interface devices. In their search for performance, attention to non-contacting switch assembly, such as photoelectric switches or 'HALL EFFECT' switches has been drawn.

Regarding photoelectric switches, an improvement in switch life, speed and reliability has been made in comparison with conventional contacting switches. However, the photoelectric switches are complicated in construction and their cost are considerably high.

Reference is made to conventional magnetic non-contacting switches employing magneto-electro converter, such as molded Hall integrated circuit (Hall IC). The Hall IC includes a silicon Hall cell, amplifier, trigger and output stage integrated with its own voltage regulator onto a monolithic silicon chip. The switch assembly comprises the Hall IC chip, and a magnet oppositely disposed to the Hall IC chip. Switching action is dependent on the proximity of an external magnet whose magnetic flux passes perpendicularly through the Hall cell on the chip face. As the external magnet is moved towards the Hall cell, the cell produces an analogue voltage proportional to the magnetic field intensity.

Although the application of the 'HALL EFFECT' switches stated above to various kinds of devices results in favorable high performance switching characteristics, some drawbacks mainly caused by moving the magnet with respect to the Hall IC chip are pointed out as follows:

First is that, with the moving magnet, it is difficult to form an uniform magnetic field because of the fact that magnetic flux density depends on a distance between the external magnet and the Hall IC. For this reason, high reliability in switching action cannot be obtained. Moreover, strict conditions on performance of the magnet is required since undesirable influences in forming the magnetic field are apt to occur, provided the magnet lacks in homogeneousness with respect to quality.

Second is that it is difficult to determined positioning or matching of the magnet and the Hall IC because of the fact that it is necessary to take into account the time during which the magnet passes over the Hall IC, the traveling speed of the moving magnet, and other parameters.

Third is that it is difficult to reduce the size of the magnet because of the fact that it is necessary to make an allowance for a displacement from the predetermined position due to the inertia force of the moving member. Fourth is that it is difficult to fabricate the magnet which is satisfactory to the above requirements.

SUMMARY OF THE INVENTION

With the above in mind, an object of the present invention is to provide a miniature contactless switching unit which has high reliability in switching action.

Another object of the present invention is to provide a miniature contactless switching unit which is applicable to various kinds of position sensors, such as a proximity switch.

Another object of the present invention is to provide a miniature contactless switching unit of which the number of parts is reduced.

Another object of the present invention is to provide a miniature contactless switching unit the size of which is reduced.

There is, according to the present invention, provided a miniature contactless switching unit comprising a molded block case including a first case portion in which a permanent magnet is provided in such a manner that one side surface of the magnet is exposed to the exterior, and a second case portion having at least a pair of opposite inner surfaces in which a magneto-electro converter is received in such a manner that it is oppositely disposed to the side surface of the magnet at a predetermined distance therefrom, the first and second case portions being integrally connected, and a screening member for screening magnetism, which operates in accordance with the movement of a moving member, whereby when the moving member is in a first position, the screening member is not disposed between the magnet and the magneto-electro converter to hold the output of the converter in a first switching state, while when the moving member is in a second position, the screening member is disposed between the magnet and the converter so as to prevent the magnetic flux passed from the magnet to the converter to hold the output of the converter to be a second switching state.

The feature and advantages of a miniature contactless switching unit according to the present invention will become more apparent from the following description taken in conjunction with the accompanying drawings, in which:

BRIEF DESCRIPTION OF THE DRAWINGS

FIG. 1 is a perspective view illustrating a miniature contactless switching unit according to the present invention.

FIG. 2 is a fragmentary, exploded view of the switching unit shown in FIG. 1.

FIG. 3 is a front view of FIG. 1.

FIG. 4 is a plan view of FIG. 3.

FIG. 5 is a partially cross sectional side elevation of FIG. 3.

FIG. 6 is a circuit block diagram of the Hall IC employed in the present invention.

FIGS. 7A to 7C illustrate some suggested interfacing approaches with respect to the application of the switching unit according to the present invention.

In these drawings, the same reference numerals indicate the same or similar elements of the miniature contactless switching unit of the present invention.

DETAILED DESCRIPTION OF PREFERRED EMBODIMENT

Figure 8:
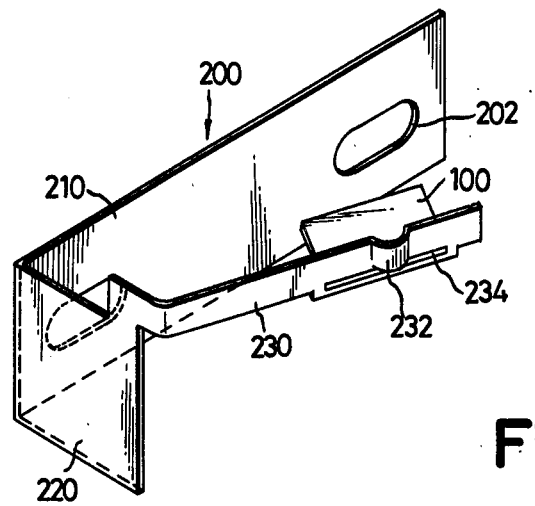
FIG. 8 is a perspective view illustrating a supporting plate for a screening member.
Figure 9:
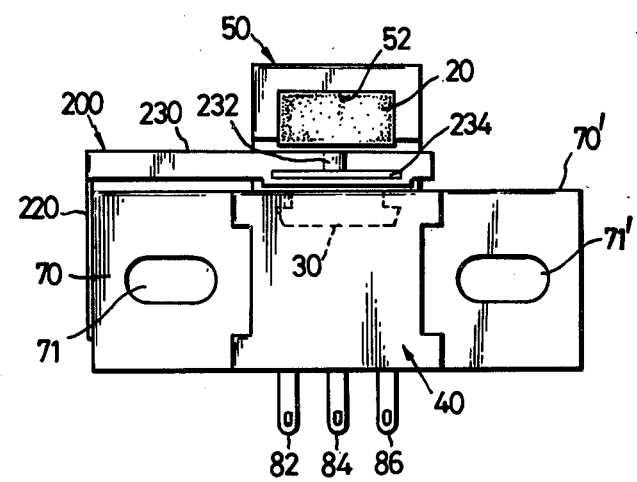
FIG. 9 is a front view of the switching unit shown in FIG. 1, in which the supporting plate shown in FIG. 8 is assembled and, FIG. 10 is a plan view showing the operation of the screening member provided at the supporting plate shown in FIG. 8.
Figure 10:
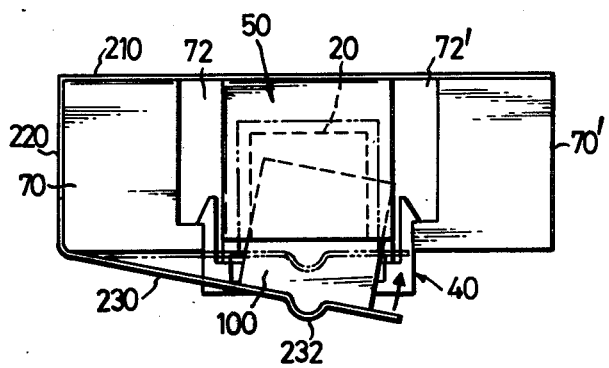

FIG. 1 shows a perspective view of the miniature contactless switching unit according to the present invention, in which respective components are assembled.

Those components and the interrelation thereof will be described in detail with reference to FIGS. 1 through 6.

As seen from FIG. 2, the miniature contactless switching unit except for a screening member to be referred to later employed in the present invention is composed of a molded block case 10, a permanent magnet 20, a magneto-electro converter 30, and a protective cover 40 to be described later in more detail.

Referring to FIG. 2, the molded block case 10 molded with polycarbonate resin briefly comprises a first case portion designated by reference numeral 50 projected upwards in which the permanent magnet 20 is provided, a second case portion designated by reference numeral 60 in which the magneto-electro converter 30, and a pair of supporting blocks designated by reference numerals 70 and 70' oppositely disposed at both sides of the second case portion 60.

More particularly, the first case portion 50 is provided with a recess 52 provided at the surface faced to the magneto-electro converter 30, in which the magnet 20 which produces a predetermined magnetic field is fitted through any suitable adhesive material (not shown). For improvement in switching action, the use of the permanent magnet of which residual magnetism and coercive force is relatively high is preferable. The second case portion 60 includes at least a pair of opposite inner surfaces 62, wherein each of inner surfaces 62 is provided at the upper end thereof with a supporting portion 64 having a groove 64a perpendicular to the longitudinal direction of the block case 10. The pair of opposite inner surfaces 62 and a bottom wall 66 integrally formed between the lower end of the opposite surfaces 62 define a cavity 68 which is substantially U-shaped in cross section. The bottom wall 66 is provided at the front side thereof with three grooves 66a into which power supply, output and ground terminals to be described later are fitted.

The pair of supporting blocks 70 and 70' are integrally provided with the second case portion 60 in such a manner that they are oppositely disposed at both sides of the pair of inner surfaces 62. Each of the supporting blocks 70 and 70' is provided with a substantially elliptical hole 71 and 71' for mounting this block case 10 at any suitable portion or devices (not shown). Reference numeral 72 designates a pair of recesses symmetrically provided at the upper and lower end of the joint portion between the second case portion 60 and the supporting block 70, respectively. In more detail, the upper recess 72 is disposed behind each supporting portion 64. Each front side of upper and lower recesses 72 is respectively provided with projections 72a for fixing a supporting leg of the protective cover which is to be described later.

Likewise, the supporting block 70' is provided with a pair of recesses 72' each of which has projections 72'a at the corresponding portions of the supporting block 70. Moreover, reference numerals 72b and 72'b are narrowed portions provided at the projections 72a and 72'a in the recesses 72 and 72', respectively.

Reference is made to the magneto-electro converter 30. In the embodiment, a Hall integrated circuit (Hall IC) chip is employed as the magneto-electro converter 30. As seen from FIG. 6, the Hall IC chip consists of a Hall cell 302, amplifier 304, Schmidt trigger 306, and output stage 308 integrated with its own voltage regulator (not shown) onto a monolithic chip. As seen from FIG. 2, the Hall IC chip 30 is provided at the both side surfaces with a pair of parallel step portions 32 each of which is fitted through the grooves 64a provided in the block case 10, when assembling the switching unit. Reference numeral 80 is a thin film-like printed circuit board onto which the Hall IC chip 30 is perpendicularly mounted at the end thereof. Reference numerals 82, 84, and 86 are terminals for the power supply, output, and ground, respectively, each of which is designated by simbols Vcc, Q output, and GND, respectively in FIG. 6. Reference numeral 90 designates an interface assembly of elements, such as, a transistor, resistor, diode etc., each of which is mounted on the printed circuit board 80 adjacent to the Hall IC chip 30. When the Hall IC chip 30 is inserted into the grooves 64a in assembling parts of the switching unit with the block case 10, the interface elements 90 are accomodated in the cavity 68 of the block case 10, and the terminals 82, 84, and 86 are fitted into the grooves 66a. Utilization of the interface elements 90 enables the switching unit according to the present invention to be compatible with circuitary devices. Moreover, it is possible to use this switching unit as Normally "off" element or Normally "on" element with a suitable inverter logic circuit. FIGS. 7A to 7C illustrate some examples of the aforementioned interfacing approaches, where $V_{DC}$ is a power supply voltage of Hall switch, $V_{CC}$ is a power supply voltage of transistor and DTL/TTL logic circuit, $V_{A-C}$ is a power supply voltage of thyristor, and $R_L$ is a load resistance. Moreover, it is also possible to form an input and/or and output circuit with the interface elements.

In addition, the protective cover 40 molded with polycarbonate resin is provided at the four corners thereof integrally with four supporting leg portions 42, respectively, each of which is perpendicularly projected from the cover surface 44 and is provided at the top end thereof with a tapered projection 42a. The tapered projection 42a can be snap fitted into the projections 72a and 72'a through the narrowed portions 72b and 72'b when the protective cover 40 is assembled with the block case 10.

Reference is now made to a screening member for screening magnetic flux, designated by reference numeral 100. As best shown in FIGS. 3 and 4, the screening member 100 of iron, chromium, and silicon is provided at a moving member (not shown), such as, a moving piece of a printer or other various kinds of devices in such a manner that it projects perpendicularly to the direction of the movement of the moving member. More particularly, the the screening member 100 is disposed in such a manner that it can travel in the space between the magnet 20 and the Hall IC chip 30.

In operation, when the moving member is in a first position, designated by symbol 'I' in FIG. 4, whereat the screening member 100 provided at the moving member is not disposed between the magnet 20 and the Hall IC chip 30, the magnetic flux produced from the magnet radiates towards the surface of the Hall IC chip 30 to hold the output of the Hall IC to be a first switching state. More particularly, an analogue voltage (for example, 'H' level) proportional to the magnetic field intensity is produced between the output terminal 84 and ground terminal 86.

When the moving member moves toward the switching unit, and then comes to a second position, designated by symbol 'II' in FIG. 4, whereat the screening member 100 is disposed between the magnet 20 and the Hall IC chip 30, the magnetic flux produced from the magnet is screened by the screening member 100. This transfers the output of the Hall IC 30 from the first switching state ('H' level) to a second switching state ('L' level).

Thus, it is possible to detect a change of the position of the moving member by driving any switable display devices with the output of the Hall IC.

Reference is made to the modified use of screening member 100. In this modification, screening member 100 is not directly mounted at the moving member but is provided in association with switching unit 10.

As best shown in FIG. 8, a resilient support plate designated by reference numeral 200 comprises a flat rectangular plate 210, having a bent portion 220 integrally provided at one end thereof, in which a pair of elliptical bores 202 are provided, and a resilient contact arm 230 one end of which is integrally connected with the extending end of the bent portion 220 in such a manner that it is disposed so as to spread externally at a predetermined angle with respect to the longitudinal direction of the rectangular plate 210. The resilient contact arm 230 is provided at the other end thereof (functioning as a free end) integrally with screening member 100 in such a manner that it is disposed perpendicularly to the extending direction of the resilient contact arm 230. Reference numeral 232 is a semi-circular projection for operation of the resilient contact arm 230. Reference numeral 234 is a slit for the purpose of facility of formation of screening member by proven bending method.

Initially, a miniature contactless switching unit is mounted on any suitable devices through the supporting member 200 in such a manner that each bore 202 provided in the supporting member 200 coincides with each bore 70 and 70' of the block case 10, respectively. After any suitable screws (not shown) are inserted into the bores 70, 70' and 202, rotation of screws bring block case 10 and the supporting member 200 to be secured to any suitable devices (not shown).

In operation, when the moving member is in its first position which is away from the switching unit 10, screening member 100 provided at the resilient contact arm 200 overlaps the space between the magnet and the Hall IC chip to hold the output of the Hall IC 30 in its first switching state. On the contrary, when the moving member moves towards the switching unit, and then presses the projection 232 provided at the resilient contact arm 200, the contact arm 200 is swung to the left hand side in FIG. 8 and is displaced in parallel with the longitudinal direction of the switching unit. Screening member 100 is thus disposed between magnet 20 and Hall IC chip 30 to prevent magnetic flux produced from magnet 20 to Hall IC chip 30. Therefore, the output of the Hall IC 30 is changed from the first switching state to the second switching state. For the same reason as the method of directly mounting screening member 100 to the moving member, it is easy to detect the change of position of the moving member by driving any suitable display device using the output of the Hall IC 30.

As will be obvious from the foregoing description, the following advantages can be obtained.

a. Since the switching unit according to the present invention comprises the fixed permanent magnet 20 oppositely position to the magneto-electro converter 30 within the block case 10, and the screening member 100 which is able to be disposed in accordance with movement of the moving member, it is easy to form an uniform magnetic field, and therefore high reliability and responsibility is obtained. This uniform magnetic field ensures large actuating distance spacing between the magnet 20 and the magneto-electro converter 30. Furthermore, the switching unit according to the present invention does not relatively suffer from an undesirable external magnetic field.

b. It is not necessary to strictly take into account homogeneousness with respect to quality of the permanent magnet 20 because of the fact that the permanent magnet 20 serving as the source of magnetic field is fixedly disposed within the block case 10. For this reason, it is possible to use a relatively cheap permanent magnet in order to obtain the desired switching characteristics.

c. The permanent magnet and the magneto-electro converter for sensing the magnetic field are oppositely disposed within the block case 10 in such a manner that a predetermined magnetic field intensity which is sufficient to detect a change of output level of the magneto-electro converter 30 due to the presence or absence of screening member 100 between the magnet 20 and the magneto-electro converter 30, is applied to the magneto-electro converter 30. For this reason, it is not necessary to adjust the positioning or matching of the magnet 20 and the magneto-electro converter 30.

d. Since the permanent magnet 20 is not mounted on the moving member, it is not necessary to take into account the inertia force of the permanent magnet 20. For this reason, it is easy to reduce the size and weight of the magnet 20. That is, the switching unit is operable with a small permanent magnet. Furthermore, it is possible to miniaturize the switching unit itself due to a reduction of the magnet 20 assembled in the switching unit.

e. The switching unit according to the present invention functions for non-contacting and contactless type switches. Therefore, the switching unit ensures high reliability and is eliminated from contact wear, mechanical contact bounce, and electrical chattering.

f. The switching unit according to the present invention is characterized in that the output level is determined according to whether the screening member 100 is disposed or not between the magnet 20 and the magneto-electro converter 30 to which a predetermined homogeneous magnetic field is applied. Therefore, it is possible to determine a change of the position of the moving member by driving any suitable display devices with the output of the magneto-electro converter 30.

g. The switching unit according to the present invention essentially consists of molded block case 10, permanent magnet 20, magneto-electro converter 30, and screening member 100. The number of parts and fabricating steps of the switching unit is reduced as compared with conventional contactless switches.

h. The output of the magneto-electro converter 30 can be interfaced directly with output circuit including interface elements 90, such as, a transistor diode or other logical circuits. In order to accomplish these interface approaches, it is sufficient to mount these interface elements 90 on the printed circuit board 80 on which magneto-electro converter 30 is mounted and to accommodate the printed circuit board 80 into the cavity 68 formed in the block case 10. An extra space for interface elements 90 is not required. That is, adding the interface elements to the elementary switching circuit does not enlarge the size of the switching unit.

i. Providing the protective cover 40 with the switching unit through the printed circuit board 80 brings about a conductive area formed on the printed circuit board 80 and interface elements 90 to be free from undesired influences of dusts.

j. The assembly of screening member as shown in FIG. 7 is suitable for a typewriter or printer paper feed positioning.

k. The switching unit according to the present invention is mainly applicable to proximity switches and applicable to other various kinds of devices, such as, automatic controller, vending machine, linear or rotational position detector, float switch, guard device for various machinery, terminal-machine or peripheral equipment in information processor, labor-saving machinery, etc.

It is to be understood that modifications and variations of the embodiments of the invention disclosed herein may be resorted to without departing from the spirit of the invention and the scope of the appended claims.

What is claimed is:

1. A miniature contactless switching unit comprising
(a) a molded block case including:
   a first case portion having a recess, a permanent magnet in said recess,
   one side surface of said magnet being exposed to the exterior, and
   a second case portion having at least opposite inner surfaces for receiving a magneto-electro converter,
   said converter being oppositely disposed to said side surface of said magnet at a predetermined distance therefrom, and
   said first and second case portions being integrally connected; and,
(b) a screening member for screening magnetism, movable in response to the movement of a moving member, said moving member being movable from a first position to a second position,
   said screening member not being disposed between said magnet and said magneto-electro converter to hold the output of said converter in a first switching state when said moving member is in said first position, and
   said screening member being disposed between said magnet and said converter to prevent the effect of the magnetic flux from said magnet from acting on said converter to hold the output of said converter in a second switching state when said moving member is in said second position.

2. A miniature contactless switching unit as defined in claim 1 including
   a supporting portion at each of said opposite surfaces at the upper end thereof,
   each said supporting portion having a groove perpendicular to the longitudinal direction of said block case, and
   said magneto-electro converter being removably fitted into each said groove.

3. A miniature contactless switching unit as defined in claim 1 including
   a bottom wall integrally formed between said inner surfaces, and said bottom wall together with said pair of opposite inner surfaces form a substantially U-shap-d cavity.

4. A miniature contactless switching unit as defined in claim 3, further comprising
   a pair of blocks integrally provided with said second case portion,
   said blocks being oppositely disposed at both sides on said inner surfaces of said cavity, and
   each of said blocks having a hole for fixing said block case to any suitable portion or devices.

5. A miniature contactless switching unit as defined in claim 4, wherein said magneto-electro converter comprises:
   a printed circuit board including an interface element assembled thereon and which constitutes at least one of an input and output circuit of said switching unit,
   a Hall integrated circuit element mounted on said printed circuit board, said Hall element being disposed perpendicularly to the end of said printed circuit board, and
   said interface element being accommodated within said cavity.

6. A miniature contactless switching unit as defined in claim 5, including
   a protective cover which is snap fitted into said switching unit for covering the surface of said printed circuit board.

7. A miniature contactless switching unit as defined in claim 1, wherein said screening member is operatively associated with said moving member.

8. A miniature contactless switching unit as defined in claim 4, including
   a resilient supporting plate for supporting said screening member,
   said resilient supporting plate comprising a flat rectangular plate, including a bent portion integrally provided at one end thereof and having a pair of bores therein, and
   a resilient contact arm one end of which is integrally provided at the extending end of said bent portion,
   said resilient contact arm being disposed externally at a predetermined angle with respect to the longitudinal direction of said rectangular plate,
   said resilient contact arm being provided at the other end thereof integrally with said screening member, and
   said screening member being disposed perpendicularly to the extending direction of said resilient contact arm, whereby after said resilient supporting plate is fitted over said block case so as to align said bores in said supporting plate and said holes in said block case, respectively, and said block case is then mounted together with said supporting plate onto any suitable fixing member by means of screws passing through the aligned bores and holes, and said screening member overlaping the space between said magnet and said magneto-electro converter to hold the output of said converter in the first switching state when said moving member is in the first position which is away from the switching unit, and said contact arm is swung inwardly with respect to the longitudinal direction of said block case to position said screening member between said magnet and said magneto-electro converter when said moving member moves toward the switching unit and then presses said resilient contact arm, thereby to transfer the output of said converter from the first switching state to the second switching state.

* * * * *

UNITED STATES PATENT AND TRADEMARK OFFICE
CERTIFICATE OF CORRECTION

PATENT NO. : 4,156,820
DATED : May 29, 1979
INVENTOR(S) : Hiroshi Fakuda, Haruo Matsuzaka It is certified that error appears in the above-identified patent and that said Letters Patent are hereby corrected as shown below:

Col. 2, Line 57   after the word "assembled" insert --;--

Col. 4, Line 22   after the word "with" insert --other--

Col. 5, Line 7   "switable" should be --switchable--

Signed and Sealed this

Eighteenth Day of September 1979

[SEAL]

Attest:

LUTRELLE F. PARKER

Attesting Officer

Acting Commissioner of Patents and Trademarks